United States Patent
Riggs et al.

(10) Patent No.: US 6,764,551 B2
(45) Date of Patent: Jul. 20, 2004

(54) PROCESS FOR REMOVING DOPANT IONS FROM A SUBSTRATE

(75) Inventors: David B. Riggs, New Fairfield, CT (US); Rajarao Jammy, Wappingers Falls, NY (US); John Kim, Wappingers Falls, NY (US); Stephen M. Lucarini, Pleasant Valley, NY (US); George L. Mack, Pleasant Valley, NY (US); Christopher Parks, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 116 days.

(21) Appl. No.: 09/971,820

(22) Filed: Oct. 5, 2001

(65) Prior Publication Data

US 2003/0066542 A1 Apr. 10, 2003

(51) Int. Cl.[7] ................................................. B08B 7/04
(52) U.S. Cl. ................................ 134/2; 134/11; 134/30
(58) Field of Search ................................. 134/31, 2, 11, 134/19, 21, 30, 37, 34, 26; 438/906

(56) References Cited

U.S. PATENT DOCUMENTS

| 5,201,960 | A | * | 4/1993 | Starov | 134/11 |
| 5,895,272 | A | * | 4/1999 | Li | 438/705 |
| 6,107,135 | A |   | 8/2000 | Kleinhenz et al. | 438/249 |
| 6,312,996 | B1 | * | 11/2001 | Sogo | 438/298 |

* cited by examiner

*Primary Examiner*—Alexander Markoff
(74) *Attorney, Agent, or Firm*—Cantor Colburn LLP

(57) ABSTRACT

A process for removing dopant ions from a semiconductor substrate includes exposing the substrate to a non-aqueous organic solvent in liquid and/or vapor form.

12 Claims, 3 Drawing Sheets

PROCESS FOR REMOVING DOPANT IONS FROM A SUBSTRATE

BACKGROUND OF THE INVENTION

The present disclosure relates to device fabrication and in particular, to a process for removing dopant ions from a semiconductor substrate.

In device fabrication, dopant or impurity ions are introduced into the semiconductor material to alter its electrical conductivity. One technique of introducing dopant ions into the semiconductor material is with an ion implanter. An ion implanter typically uses a high current accelerator tube equipped with steering and focusing magnets to bombard the surface of the semiconductor material with dopant ions to impart the desired electrical properties. These dopant ions are implanted into the top layer of the semiconductor material and just below the surface, changing the conductivity of a precise region. To create a p-type region, an acceptor ion such as boron, gallium or indium is implanted. To create an n-type region, a donor ion such as antimony, arsenic, phosphorous or bismuth is implanted.

As the ions enter the material, they collide with target atoms and come to rest at an average depth below the surface of the substrate. The average depth at which the ions are distributed varies with the implant energy as well as with the target material and the species of ion being implanted. For a given target material and ion species, higher energy generally corresponds to a deeper penetration of the ions into the material. The dose or the total number of ions entering the target is controlled by monitoring the ion current during implantation as well as the time of implantation.

A variation of conventional ion implantation is a plasma ion immersion process, wherein the material itself is placed directly in the plasma source while applying an accelerating bias (on the order of a few kV) to the material. This is an attractive alternative to conventional ion implantation techniques as high dose rates (in the range of $10^{15}/cm^2$ min) can be achieved at lower energies with less cost intensive ion implantation equipment modification. Typically the target to be implanted is placed directly in the plasma and then biased to a negative potential in order to sufficiently accelerate positive ions into the target for implantation.

Gaseous diffusion of dopants is another method employed to form doped regions. A gas or vapor containing the desired dopants is deposited onto the wafer and then thermally diffused into the substrate surface, such as by chemical vapor deposition.

An alternative to ion implantation and gaseous diffusion processes is the use of a doped dielectric film as a dopant diffusion source. In this alternative approach, a doped dielectric film such as boron silicate glass or arsenic silicate glass, is deposited onto a substrate and used as a source of dopant ions which are diffused into the substrate to form doped regions. For example, doped dielectric films are deposited at temperatures less than 500° C. in a deposition chamber, and subsequently heated at temperatures greater than 500° C. in a different chamber, such as an annealing furnace, to perform the dopant diffusion to form the doped region.

All of the above described processes for introducing dopant ions have a propensity for forming dopant ions at the surface. Depending on the device properties, the presence of dopant ions at the surface may be deleterious to device performance. Control of the dopant ions is critical to device performance because, as noted, diffusing or implanting dopant ions changes the electrical characteristics of the semiconductor material. Diffusion or implantation of the ions into undesired areas or regions can detrimentally affect device performance. For example, diffusion or implantation of arsenic dopant ions into a shallow trench isolation region can cause parasitic lateral leakage. Shallow trench isolation regions are typically fabricated into the integrated circuit to isolate neighboring devices. Leakage underneath the shallow trench isolation region from one device to another is exacerbated by the presence of dopant ions, thereby detrimentally affecting device performance. Another example of damage caused by ions implanted or diffused into undesired areas may occur during the fabrication of vertical DRAM cell array devices. In the vertical DRAM cell, the sidewalls of the isolation trench are used as the channel of the array device. The presence of dopant ions in the sidewalls, e.g., arsenic ions, would undesirably create large fluctuations on the array device threshold voltage. The noted examples are exemplary only and are used to highlight the potential problems caused by the presence of unwanted dopant ions in the semiconductor material.

Cleaning methods are frequently employed during the fabrication process to remove contaminants and residues from the wafer resulting from the various processing steps. These cleaning processes are generally aqueous based and are optimized for removing inorganic, organic and/or particulate matter. The so-called "RCA clean" has been the standard cleaning sequence utilized by the industry for cleaning silicon wafers for the past two decades. An RCA clean process comprises a multitude of steps that may be implemented in whole, or in part, at various stages during manufacture of the semiconductor circuit.

The RCA process includes a so-called "piranha" cleaning step. The piranha cleaning step typically comprises dipping the wafers in an inorganic oxidant, such as a solution containing sulfuric acid and hydrogen peroxide. This step is intended to remove organic material from a surface of the semiconductor article. A typical piranha cleaning solution would comprise hydrogen peroxide ($H_2O_2$) and sulfuric acid ($H_2SO_4$) in a ratio of about 1:5 to about 1:50 (hydrogen peroxide:sulfuric acid). The wafers are then rinsed with deionized water. The deionized water rinse typically occurs at room temperatures, commonly from about 18° C. to about 23° C. Preferably, the rinse utilizes water with a high resistivity, such as from about 10 megohms-centimeter to about 18 megohms-centimeter.

The wafers are then subjected to a so-called "HF clean". The HF clean is typically used to remove an oxide film from the surfaces of the semiconductor wafers. Such oxide film may be formed, for example, during the above-discussed piranha clean or due to exposure of the semiconductor wafer or other article to air or other sources of oxygen, e.g., hydrogen peroxide. The HF clean typically involves dipping the wafers in a solution of water and hydrofluoric acid, with the water: hydrogen fluoride ratio commonly being in the range of from approximately 1000:1 to approximately 100:1. The wafers are then rinsed with deionized water to remove hydrogen fluoride and various materials loosened from the surface of the wafer.

The wafers may then be subjected to a so-called "Standard Clean 1" step, commonly referred to as an "SC1" step. The SC1 step is principally directed to removing various particulate materials from the semiconductor surfaces which can more easily attach as a result of the surface being made hydrophobic by the hydrogen fluoride cleaning step explained above, step 1C. In a typical SC1 step, the wafers are submerged in a solution of water, hydrogen peroxide and ammonium hydroxide (for example 5:1:1 by volume), at temperatures from about 75° C. to about 80° C. for a time of from about 2 minutes to about 15 minutes. The wafers are then rinsed with deionized water to remove the SC1 solution from the wafers.

The wafers may also be subjected to a so-called "Standard Clean 2" step, commonly referred to as an "SC2" step. The SC2 step is thought to desorb atomic and ionic contaminants from the wafers. In particular, the SC2 step is intended to remove metals deposited on the wafer surface during the HF cleaning step and SC1 step. In a typical SC2 step, the wafers are submerged in a solution of $H_2O:HCl:H_2O_2$ (for example 6:1:1 by volume). The SC2 step can be carried out at temperatures which are elevated above fabrication room temperatures. Examples of elevated temperatures sometimes used are from about 75° C. to about 80° C. The SC2 step can be effected for various times, for example for times from about 1 to about 10 minutes. The wafers are then subjected to a deionized water rinse, similar to the rinse described above regarding SC1, to remove the above-described SC2 solution from the wafers.

Conventional cleaning methods generally modify the wafer surface to remove contaminants and are not effective for removing dopant ions from the surfaces of the semiconductor substrate.

SUMMARY OF THE INVENTION

A method for removing dopant ions from an undesired area of a semiconductor substrate includes exposing the undesired area to a non-aqueous organic vapor, wherein the undesired area includes a surface containing the dopant ions; and removing the vapor and dopant ions from the undesired area of the substrate. Exposing the undesired area to the vapor preferably occurs prior to formation of a surface oxide layer in the undesired area. The dopant ions are selected from the group consisting of arsenic, gallium, indium, phosphorous, boron, antimony and bismuth ions. In a preferred embodiment, the vapor is hexamethyldisilizane.

In another embodiment, a method of cleaning a surface of a partially manufactured integrated circuit subsequent to implantation or diffusion of dopant ions into the surface includes coating the surface containing dopant ions with a non-aqueous organic solvent. The solvent is preferably selected from a group consisting of ketones, polyhydric alcohols, cyclic ethers and esters. The method further includes removing the solvent and dopant ions from the surface.

Other embodiments of the invention are contemplated to provide particular features and structural variants of the basic elements. The specific embodiments referred to as well as possible variations and the various features and advantages of the invention will become better understood when considered in connection with the detailed description and drawings that follow.

DETAILED DESCRIPTION OF PREFERRED EMBODIMENTS

Figure 1:
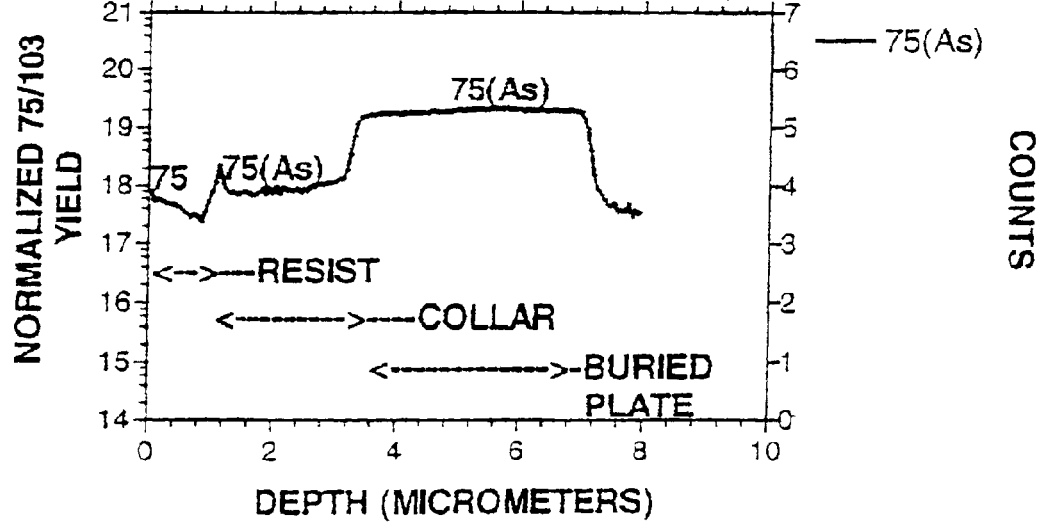
FIG. 1 is a graph showing normalized yields of arsenic ions as a function of depth for a trench array after exposure to solvent and photoresist fill.

A process for removing dopant ions from a semiconductor substrate, e.g., wafers, includes exposing the substrate to a non-aqueous organic solvent suitable for removing, extracting and/or diffusing dopant ions from the substrate. The solvent may be applied in the form of a liquid or a vapor for a period of time effective to selectively remove the dopant ions. Exposing the wafer to the non-aqueous organic solvent has unexpectedly been found to effectively remove dopant ions from undesired areas or regions in the semiconductor surface.

The application of the solvent to wafer surfaces can be performed by wafer spin coating, immersion coating, vapor coating or the like. The process may employ conventional coating equipment commonly utilized during device fabrication thus advantageously avoiding special equipment. For example, non-aqueous organic solvent delivered to the wafer in a vapor state may utilize vapor coating equipment such as a vapor priming system of the type utilized for priming wafers prior to photoresist deposition. These types of vapor priming systems generally consist of a primer source and a wafer priming chamber. The primer source may be the solvent in liquid form that is heated to its vapor point or alternatively, the liquid solvent is bubbled with nitrogen gas to generate a nitrogen/vapor stream. In the event the solvent is applied to the substrate as a liquid, the use of standard coating apparatus for coating photoresist compositions is preferred. In this manner, the solvent may be applied to the substrate by spin coating, immersion coating or the like. The invention is not limited to any particular coating application method in this or any of the following embodiments.

The solvents employed are preferably non-destructive to the substrate, e.g., non-oxidizing, non-reducing and preferably do not cause removal or modification of the substrate surface. Preferably, the solvent is an organic compound or a mixture thereof that is a liquid at room temperature and/or a vapor under vapor forming conditions. Preferred solvents are those normally employed during the manufacture of the integrated circuit, e.g., photoresist solvents. Examples of suitable solvents applied in the form of a liquid include ketone solvents such as acetone, methyl ethyl ketone, cyclohexanone, methyl isoamyl ketone and 2-heptanone, polyhydric alcohols and derivatives thereof such as ethyleneglycol, ethyleneglycol monoacetate, diethyleneglycol, diethyleneglycol monoacetate, propyleneglycol, propyleneglycol monoacetate, dipropyleneglycol and dipropyleneglycol monoacetate as well as monomethyl, monoethyl, monopropyl, monobutyl and monophenyl ethers thereof, cyclic ethers such as dioxane, and ester solvents such as methyl lactate, ethyl lactate, methyl acetate, ethyl acetate, butyl acetate, methyl pyruvate, ethyl pyruvate, methyl methoxypropionate and ethyl ethoxypropionate. These organic solvents can be used either singly or as a mixture of two kinds or more according to need. The solvent may include other components such as components used in formulating photoresists. Other suitable solvents applied in the form of a liquid will be apparent to those skilled in the art in view of this disclosure.

Examples of suitable solvents applied in the form of a vapor include non-aqueous ammonium compounds or an ammonium bearing compounds. Ammonium bearing compounds include those compounds that react with the surface of the substrate to generate ammonia as a byproduct. For example, hexamethyldisilazane (HMDS) is a compound that is commonly used in semiconductor manufacturing processes. HMDS is typically used as a primer for increasing adhesion of a photoresist layer to the substrate. HMDS reacts by hydrolysis with any silanol groups present on the substrate surface and generates ammonia as a byproduct. In this manner, HMDS increases the hydrophobicity of the wafer. For the purposes of removing dopant ions, it is preferred that HMDS is delivered as a vapor utilizing conventional vapor priming equipment. Advantageously, this, minimizes the expense associated with the process since most, if not all, semiconductor fabrication processes employ HMDS as a primer and further employ vapor priming equipment as its mode of delivery. Thus, the process can be easily integrated into current semiconductor manufacturing processes.

The process is effective for removing dopant ions such as boron, gallium or indium antimony, arsenic, phosphorous or bismuth ions. In a preferred embodiment, the process is employed to remove arsenic ions from undesired areas or regions. Preferably, the substrate is heated to increase the removal efficiency of the dopant ions. For illustrative purposes only, an increase of about 1.4 times was observed for an arsenic ion removal process utilizing a solvent applied in the form of a photoresist to the surface. The increase of about 1.4 times was observed when the wafer temperature was increased from 110° C. to 215° C. The photoresist formulation, deposited to a thickness of about 1.4 microns, is known under the tradename AZ751 and is commercially available from the Hoechst Corporation.

The process overcomes the problems noted in the prior art and can be implemented to remove dopant ions from any dopant ion containing surfaces. For example, the process can be used to remove arsenic ions in the collar region of a trench capacitor. Trench capacitors are generally used for storing data and are described in U.S. Pat. No. 6,107,135 entitled "Method of Making a Semiconductor Memory Device Having a Buried Plate Electrode" to Kleinhenz et al. In manufacturing trench capacitors, a collar region for the trench capacitor creates a vertical isolation region between a buried plate and a buried strap. The manufacturing process may employ the use of dopant source films, e.g., arsenic glass films, that are typically formed on the deep trench surfaces. Parasitic leakage between the plate and strap can occur due to the presence of arsenic ions in the collar region. The removal process is preferably utilized after the node nitride is removed from the collar region of the trench capacitor. Advantageously, the use of the process minimizes parasitic leakage. In another example, the process may be used to remove arsenic ions from the surfaces of a shallow trench isolation region (STI). Removing ions from the isolation region surfaces, after the STI has been etched and prior to surface oxidation, minimizes and/or prevents parasitic lateral leakage from occurring underneath the STI region. In yet another application, the process may be employed during the fabrication of vertical gate DRAM cells. In a vertical gate DRAM cell, the sidewalls of the isolation trench are used as the channel of the array device. The presence of dopant ions in the sidewalls, e.g., arsenic ions, would undesirably create large fluctuations on the array device threshold voltage. Preferably, the cleaning process is utilized prior to gate oxidation.

The following examples fall within the scope of, and serve to exemplify, the more generally described methods set forth above. The examples are presented for illustrative purposes only, and are not intended to limit the scope of the invention.

EXAMPLES

Example 1

In this example, the mass profiles of arsenic ions (mass 75) through arrays of deep trenches were measured by Secondary Ion Mass Spectrometry (SIMS). The deep trenches are used to form a trench capacitor. The trench is typically filled with n+doped poly which serves as one plate of the capacitor (referred to as the storage node). The second plate of the capacitor, referred to as a "buried plate," is formed by, for example, outdiffusing n+ dopants from a dopant source into a region of the substrate surrounding the lower portion of the trench. A dielectric layer is provided to separate the two plates forming the capacitor. To prevent or reduce parasitic leakage that occurs along the upper portion of the trench to an acceptable level, an oxide collar of sufficient thickness is provided therein. An arsenic-silicate glass (ASG) is deposited to form doped glass spacers on the sidewalls of the apertures above the deep trenches. The wafer, including the deep trenches, was then exposed to a vapor of hexamethyldisilazine and then filled with approximately 0.1 microns of photoresist. The arsenic signal was measured from the surface to a depth of 0.8 microns. The portion of the wafer monitored for arsenic ions includes the thickness of the photoresist, the collar region and the buried plate region. As shown in FIG. 1, an elevated arsenic signal count in the photoresist layer in the collar region of the deep trench was observed indicating that the arsenic ions diffused from the wafer surface into the photoresist layer.

Example 2

Figure 2:
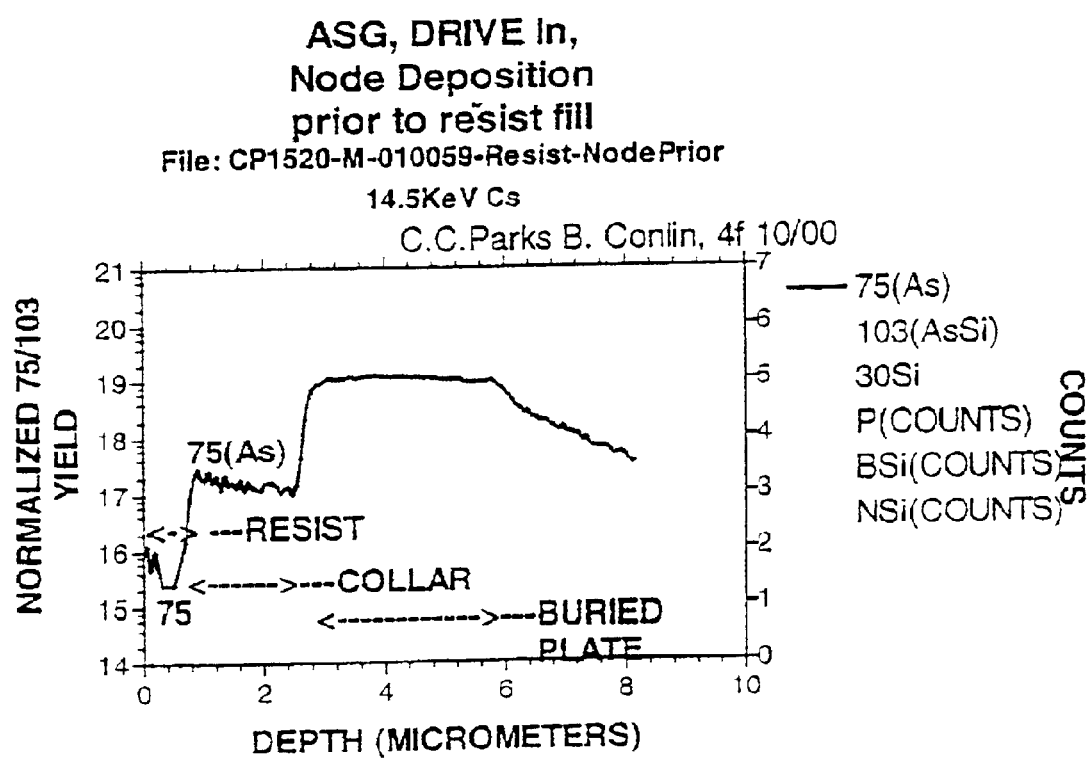
FIG. 2 is a graph showing normalized yields of arsenic ions as a function of depth for a trench array with a node dielectric prior to solvent exposure and photoresist fill.

In this example, the mass profiles of arsenic ions through arrays of deep trenches were analyzed as in example 1. A thin dielectric layer, i.e., the node, is deposited onto the arsenic containing surfaces of the wafer prior to the steps of exposing the substrate to the HMDS vapor and photoresist deposition processes. As shown in FIG. 2, diffusion of the arsenic ions are blocked by the presence of the dielectric layer. The arsenic signal in the photoresist layer is approximately 100 times less than the signal observed in the same region shown in FIG. 1. The results demonstrate that exposing the arsenic containing silicon surfaces to an HMDS vapor effectively removed arsenic ions from the surface of the array.

Example 3

Figure 3:
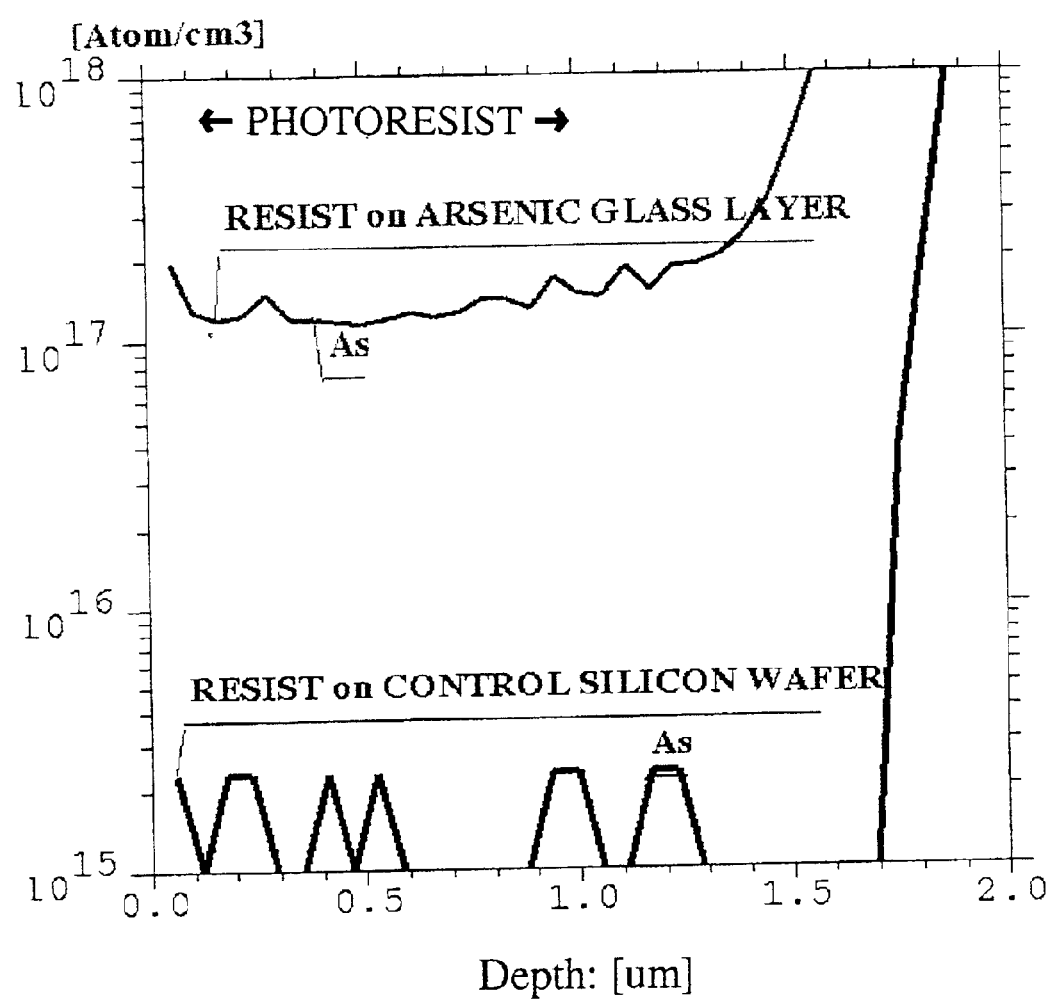
FIG. 3 is a graph showing the amount of arsenic ions present in a solvent layer applied in the form of a photoresist as a function of depth into the solvent layer.

In this example, silicon wafers were exposed to an arsenic ion implant dose of $5E13/cm^2$. A solvent in the form of a photoresist formulation was then applied to the wafer surface. Secondary mass ion spectroscopy was employed to determine the arsenic content in the photoresist layer. These wafers were compared to control wafers coated with the same photoresist formulation that were not exposed to the implant process. The results are shown in FIG. 3.

The results clearly show an increase of arsenic ions into the solvent layer for wafers exposed to the arsenic ion implant dose.

While preferred embodiments have been shown and described, various modifications and substitutions may be made thereto without departing from the spirit and scope of the disclosure. Accordingly, it is understood that the present disclosure has been described by way of illustrations and not limitation.

We claim:

1. A method for removing dopant ions from a surface of a semiconductor substrate, the method comprising:

exposing the surface containing the dopant ions to a vapor containing an ammonium bearing compound, wherein the ammonium bearing compound is selected to react with the surface to produce ammonia;

diffusing dopant ions into the vapor;

removing the vapor and dopant ions from the surface of the substrate, wherein an amount of the donant ions at the surface of the substrate decreases after removing the vapor; and rinsing the substrate with water.

2. The method according to claim 1, wherein the ammonium bearing compound comprises hexamethyldisilazane in an amount effective to remove the dopant ions from the surface of the substrate.

3. The method according to claim 1, wherein the dopant ion is selected from the group consisting of arsenic, gallium, indium, phosphorous, boron, antimony and bismuth ions.

4. The method according to claim 1 further comprising a dehydration bake prior to exposing the substrate to the vapor.

5. The method according to claim 1, wherein the surface comprises a shallow trench isolation region or a collar region of a trench capacitor.

6. The method according to claim 1, wherein exposing the surface to the vapor occurs prior to formation of a surface oxide layer or deposition of a photoresist layer on the surface.

7. The method according to claim 1, wherein exposing the surface to the vapor occurs after a node nitride is removed from a collar region of a trench capacitor.

8. The method according to claim 1, wherein the surface is a collar region formed between a buried plate and a buried strap of a trench capacitor.

9. A method for removing dopant ions from a semiconductor substrate comprises:

applying a vapor of an ammonium bearing compound to a surface of the substrate, wherein the surface includes the dopant ions;

reacting component in the vapor with the surface of the substrate and generating an ammonia as a product;

removing the vapor and dopant ions from the surface of the substrate, wherein an amount of the dopant ions at the surface of the substrate decreases after removing the vapor; and rinsing the substrate with water.

10. The method according to claim 9, wherein the dopant ions are selected from the group consisting of arsenic, gallium, indium, phosphorous, boron, antimony and bismuth ions.

11. The method according to claim 10, wherein the surface comprises a shallow trench isolation region or a collar region of a trench capacitor.

12. The method according to claim 10, wherein applying the vapor to the surface of the substrate occurs prior to formation of an oxide layer on the surface.

* * * * *